(12) United States Patent
Jiang et al.

(10) Patent No.: US 11,527,995 B2
(45) Date of Patent: Dec. 13, 2022

(54) PASSIVE WIDEBAND MIXER

(71) Applicant: NanJing Milliway Microelectronics Technology Co., LTD., Jiangsu (CN)

(72) Inventors: Mei Jiang, Jiangsu (CN); Ying Zhang, Jiangsu (CN); Mengjiao Si, Jiangsu (CN)

( * ) Notice: Subject to any disclaimer, the term of this patent is extended or adjusted under 35 U.S.C. 154(b) by 0 days.

(21) Appl. No.: 17/296,494

(22) PCT Filed: Oct. 22, 2019

(86) PCT No.: PCT/CN2019/112627
§ 371 (c)(1),
(2) Date: May 24, 2021

(87) PCT Pub. No.: WO2020/125192
PCT Pub. Date: Jun. 25, 2020

(65) Prior Publication Data
US 2022/0077824 A1       Mar. 10, 2022

(30) Foreign Application Priority Data

Dec. 21, 2018 (CN) .......................... 201811568476.X

(51) Int. Cl.
*H03D 7/02*       (2006.01)
*H03D 7/14*       (2006.01)
*H03C 1/58*       (2006.01)

(52) U.S. Cl.
CPC ................. *H03D 7/02* (2013.01); *H03C 1/58* (2013.01); *H03D 7/1408* (2013.01); *H03D 2200/0013* (2013.01); *H03D 2200/0023* (2013.01)

(58) Field of Classification Search
CPC .. H03D 7/1408; H03D 9/0608; H03D 9/0633; H03D 2200/0023; H03D 2200/0013; H03D 7/02; H03C 1/58
See application file for complete search history.

(56) References Cited

U.S. PATENT DOCUMENTS 5,339,462 A  *  8/1994  Staudinger ........... H03D 7/1408
                                                            455/330
5,854,974 A  *  12/1998  Li ........................ H03D 7/1408
                                                            455/330
2003/0157918 A1      8/2003  Gamliel

FOREIGN PATENT DOCUMENTS

| CN | 103338008 A | 10/2013 |
|---|---|---|
| CN | 103647511 A | 3/2014 |
| CN | 204966644 U | 1/2016 |
| CN | 106156435 A | 11/2016 |
| CN | 106160669 A | 11/2016 |
| CN | 107786168 A | 3/2018 |

(Continued)

Primary Examiner — Ryan Johnson
(74) Attorney, Agent, or Firm — Rumit Ranjit Kanakia

(57) ABSTRACT

The invention discloses a passive wideband mixer, including a local oscillator balun, a radio frequency balun, a first diode D1, a second diode D2, a third diode D3, a fourth diode D4, an inductive compensation unit, and a lossy inductive grounding network. The invention can realize a mixer with a bandwidth ratio of not less than 1:7, and can effectively suppress points with isolation deterioration without affecting the conversion loss over the entire frequency band. In the entire frequency band of this design, the isolation indicator between the local oscillator and radio frequency ports is optimized, which can well satisfy the application of the wideband mixer in a communication system.

5 Claims, 4 Drawing Sheets

(56) References Cited

FOREIGN PATENT DOCUMENTS

| CN | 108649904 A | 10/2018 |
| CN | 109450381 A | 3/2019 |
| CN | 209375584 U | 9/2019 |

* cited by examiner

PASSIVE WIDEBAND MIXER

BACKGROUND

Technical Field

The invention relates to the field of integrated circuit technologies, and in particular, to a passive wideband mixer.

Related Art

Mixers have always been widely used in communications and are key components for frequency conversion. In the field of integrated circuits, passive mixers are a preferred option in many scenarios due to their advantages such as good port isolation, wide bandwidth, and no need for DC power supply. Because a passive mixer requires a relatively large local oscillator drive power, the isolation indicator between the local oscillator port and the radio frequency port is particularly important in applications. A signal leaking from the radio frequency port will be radiated out by the antenna, causing interference to other devices. What's worse, the signal may also be received by the circuit from the antenna, leading to problems such as self-mixing and signal blocking (sensitivity degradation), which will seriously interfere with subsequent circuits.

Most of traditional passive mixers adopt diodes as core components. Based on the comprehensive consideration of linearity, bandwidth, isolation and other indicators, a double-balanced structure is a preferred option. As shown in FIG. 1, this traditional circuit structure can realize a mixer design with better performance within a certain bandwidth range. To achieve a double-balanced structure, a balun circuit is needed. A commonly used balun is composed of two coupled microstrip lines with an electrical length of ¼ wavelength, and can achieve an ultra-wide bandwidth in a 50 ohm matching environment. However, as a one-way conduction device, the diode is difficult to achieve wideband matching with the balun circuit, but the balun circuit is a key factor in determining the isolation indicator between the local oscillator and the radio frequency port. Therefore, it can be seen that traditional wideband (generally with a bandwidth ratio of less than 1:4) passive double-balanced mixers have a relatively poor isolation indicator within a certain frequency range in the entire frequency band. As shown in FIG. 2, the isolation indicator is lowest at −20 dB, and it is difficult to optimize the isolation indicator over the entire frequency band. Therefore, it is very necessary to propose a novel circuit structure specially for a wideband mixer, which can achieve a better isolation indicator between the local oscillator and radio frequency ports in the entire frequency band of the wideband mixer without affecting the operating bandwidth of the mixer.

SUMMARY

The technical problem to be solved by the invention is to provide a passive wideband mixer with an optimized isolation indicator between the local oscillator and radio frequency ports, which can well satisfy the application of the wideband mixer in a communication system.

To solve the above technical problems, the invention provides a passive wideband mixer, including: a local oscillator balun, a radio frequency balun, a first diode D1, a second diode D2, a third diode D3, a fourth diode D4, an inductive compensation unit, and a lossy inductive grounding network, where the first diode D1, the second diode D2, the third diode D3, and the fourth diode D4 are connected end to end to form a loop; the local oscillator balun has one end connected to the connection point between the first diode D1 and the fourth diode D4 and another end connected to the connection point between the second diode D2 and the third diode D3 through the inductive compensation unit and the lossy inductive grounding network; and the radio frequency balun has one end connected to the connection point between the first diode D1 and the second diode D2 and another end connected to the connection point between the third diode D3 and the fourth diode D4.

Preferably, the inductive compensation unit is connected in series between a +90° output of the local oscillator balun and the diode loop, and is implemented by a second on-chip spiral inductor L2; and the lossy inductive grounding network is connected in parallel at the connection point between the second diode D2 and the third diode D3, and is implemented by connecting a first on-chip spiral inductor L1 and an on-chip resistor R1 in parallel followed by grounding at one end.

Preferably, for a wideband mixer with a bandwidth of 6-26.5 GHz, an inductance of the second on-chip spiral inductor L2 is 0.2 nH-0.5 nH.

Preferably, for a wideband mixer with a bandwidth of 6-26.5 GHz, an inductance of the on-chip spiral inductor L1 is 3 nH-5 nH.

Preferably, for a wideband mixer with a bandwidth of 6-26.5 GHz, a resistance of the on-chip resistor R1 is 500-600 ohm.

The invention has the following beneficial effects. The invention can realize a mixer with a bandwidth ratio of not greater than 1:7, and can effectively suppress points with isolation deterioration without affecting the conversion loss over the entire frequency band. In the entire frequency band of the mixer, the isolation indicator between the local oscillator and radio frequency ports is optimized, which can well satisfy the application of the wideband mixer in a communication system. While bringing the above-mentioned beneficial effects, the bandwidth ratio of the mixer provided by the invention can reach 1:7.

DETAILED DESCRIPTION

Figure 3:
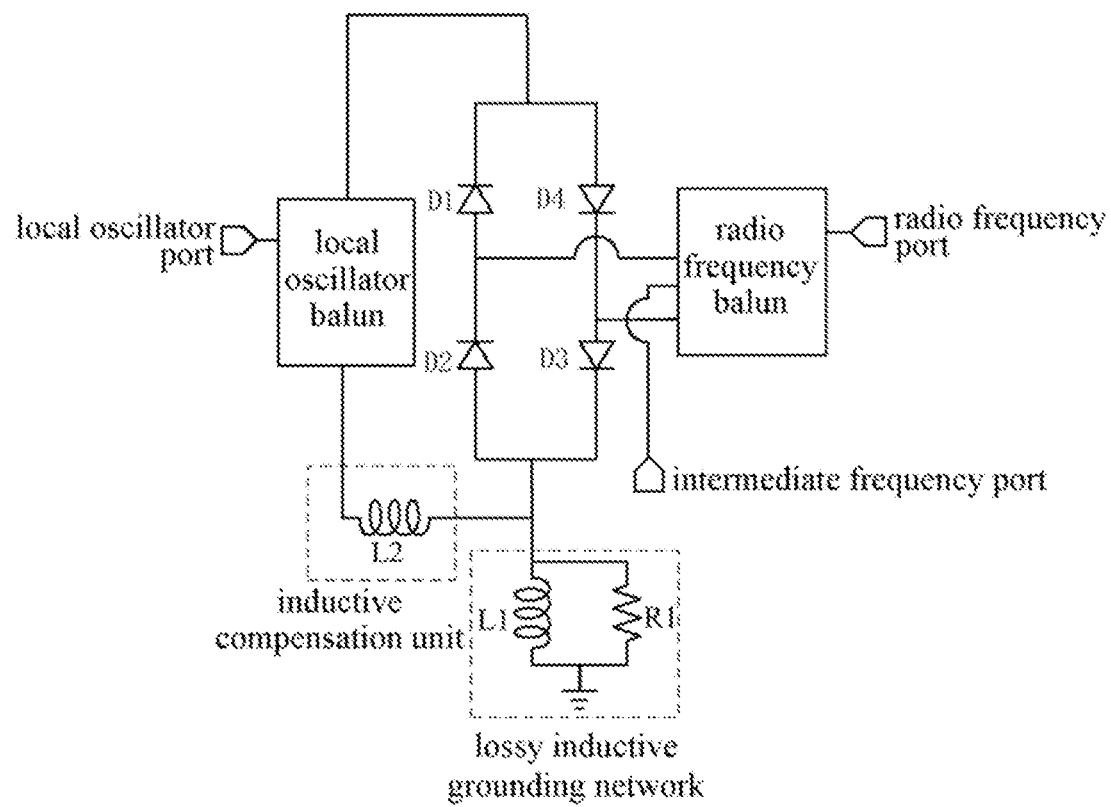
FIG. 3 is a schematic view of a mixer structure according to the invention.

As shown in FIG. 3, a passive wideband mixer includes a local oscillator balun, a radio frequency balun, a first diode D1, a second diode D2, a third diode D3, a fourth diode D4, an inductive compensation unit, and a lossy inductive grounding network. The first diode D1, the second diode D2, the third diode D3, and the fourth diode D4 are connected end to end to form a loop. The local oscillator balun has one end connected to the connection point between the first diode D1 and the fourth diode D4 and an other end connected to the connection point between the second diode D2 and the third diode D3 through the inductive compensation unit and the lossy inductive grounding network. The radio frequency balun has one end connected to the connection point between the first diode D1 and the second diode D2 and an other end connected to the connection point between the third diode D3 and the fourth diode D4.

The inductive compensation unit is connected in series between a +90° output of the local oscillator balun and the diode loop, and is implemented by a second on-chip spiral inductor L2. The lossy inductive grounding network is connected in parallel at the connection point between the second diode D2 and the third diode D3, and is implemented by connecting a first on-chip spiral inductor L1 and an on-chip resistor R1 in parallel followed by grounding at one end. A signal enters from an input of the local oscillator balun. Ideally, a +90° phase shift and a −90° phase shift are realized at outputs respectively, so that two output signals have a 180° phase difference. The ideal 180° phase difference has certain bandwidth limitations, and the lossy inductive grounding network provided herein can compensate for the 180° phase difference within the passband.

On the one hand, the mixer having the above structure with a bandwidth ratio of not less than 1:7 (that is, the upper limit frequency is 1-7 times the lower limit frequency) according to the invention can effectively suppress points with isolation deterioration without affecting the conversion loss over the entire frequency band; on the other hand, in the entire frequency band of the mixer, the isolation indicator between the local oscillator and radio frequency ports is optimized, which can well satisfy the application of the wideband mixer in a communication system. Meanwhile, compared with the prior art, the mixer provided by the invention can achieve a bandwidth ratio of 1:7 (i.e., the upper limit frequency can be as high as 7 times the lower limit frequency) while bringing the above-mentioned effects.

For a wideband mixer with a bandwidth of 6-26.5 GHz, the lossy inductive grounding network may be implemented by the first on-chip spiral inductor L1. A classical inductance value of the first on-chip spiral inductor L1 is 3 nH-5 nH. Such an inductance value can make its resonance point fall within the operating band of the mixer without causing useless consumption of energy of a local oscillator signal.

Because the first on-chip spiral inductor L1 is added to the circuit by parallel connection and grounding, it will consume local oscillator power to a certain extent. The on-chip resistor R1 connected in parallel can effectively reduce the Q value of the inductor, thereby reducing useless consumption of the local oscillator signal by the lossy inductive grounding network.

The inductive compensation unit is directly connected in series to the +90° output of the local oscillator balun, and is implemented by the second on-chip spiral inductor L2. A classical inductance value of this inductor is 0.2 nH-0.5 nH, which compensates for the electrical length of the balun to a certain extent, so that the performance of other indicators of the mixer is not affected when the lossy inductive grounding network formed by the first on-chip spiral inductor L1 and the on-chip resistor R1 achieves the optimization of the isolation between local oscillator and radio frequency.

Figure 1:
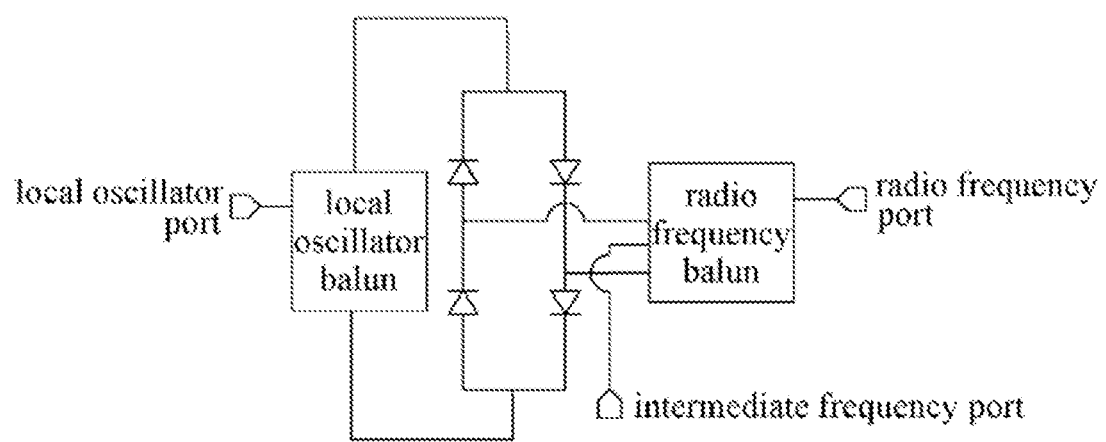
FIG. 1 is a schematic view of a traditional mixer structure.
Figure 2:
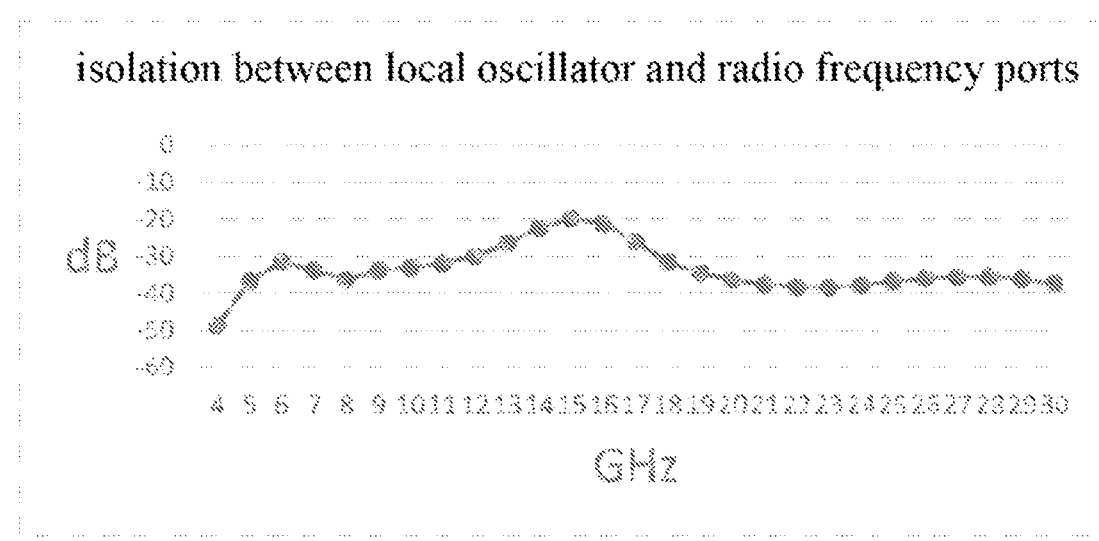
FIG. 2 is a schematic view of an isolation indicator of the traditional mixer structure.
Figure 4:
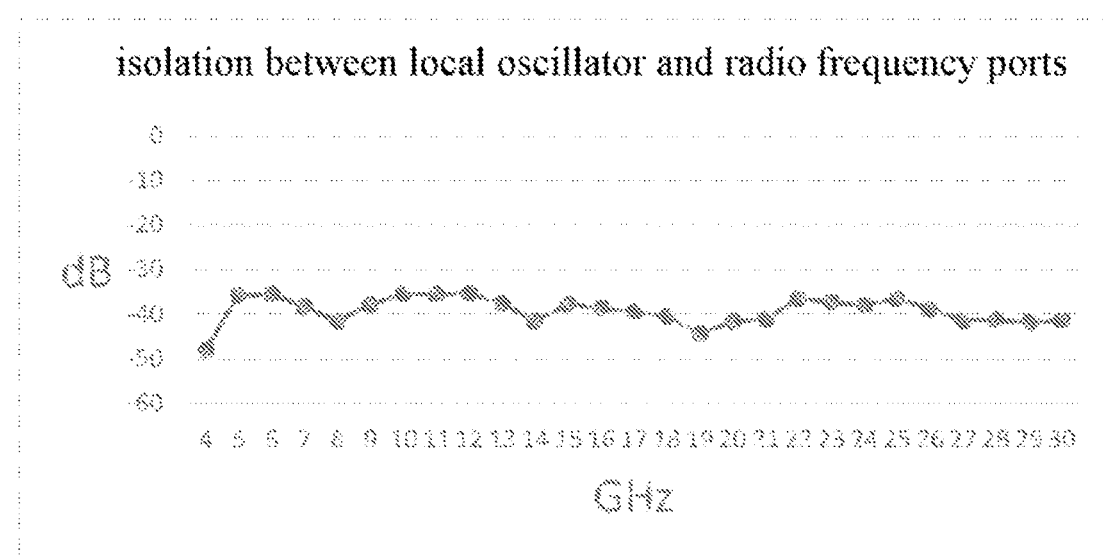
FIG. 4 is a schematic view of an isolation indicator of the mixer structure according to the invention.

All conversion losses of the traditional mixer structure that can achieve 6-26.5 GHz are not greater than −10 dB, with the isolation indicator being as shown in FIG. 2, indicating that the optimization of the isolation indicator over the entire frequency band is not achieved. The invention is suitable for a mixer bandwidth ratio of not less than 1:7. In this embodiment, a bandwidth of 6-26.5 GHz is used for experiments. The test results show that points with isolation deterioration are effectively suppressed without affecting the conversion loss over the entire frequency band, as shown in FIG. 4. As can be seen, in the entire frequency band of the mixer provided by the invention, the isolation indicator between the local oscillator and radio frequency ports is optimized, which can well satisfy the application of the wideband mixer in a communication system.

What is claimed is:

1. A passive wideband mixer, comprising: a local oscillator balun, a radio frequency balun, a first diode D1 second diode D2, a third diode D3, a fourth diode D4, an inductive compensation unit, and a lossy inductive grounding network, wherein the first diode D1, the second diode D2, the third diode D3, and the fourth diode D4 are connected end to end to form a loop; the local oscillator balun has one end connected to the connection point between the first diode D1 and the fourth diode D4 and another end connected to the connection point between the second diode D2 and the third diode D3 through the inductive compensation unit and the lossy inductive grounding network; and the radio frequency balun has one end connected to the connection point between the first diode D1 and the second diode D2 and another end connected to the connection point between the third diode D3 and the fourth diode D4.

2. The passive wideband mixer of claim 1, wherein the inductive compensation unit is connected in series between a +90° output of the local oscillator balun and the diode loop, and is implemented by a second on-chip spiral inductor L2; and the lossy inductive grounding network is connected in parallel at the connection point between the second diode D2 and the third diode D3, and is implemented by connecting a first on-chip spiral inductor L1 and an on-chip resistor R1 in parallel followed by grounding at one end.

3. The passive wideband mixer of claim 2, wherein for a wideband mixer with a bandwidth of 6-26.5 GHz, an inductance of the second on-chip spiral inductor L2 is 0.2 nH-0.5 nH.

4. The passive wideband mixer of claim 2, wherein for a wideband mixer with a bandwidth of 6-26.5 GHz, an inductance of the on-chip spiral inductor L1 is 3 nH-5 nH.

5. The passive wideband mixer of claim 2, wherein for a wideband mixer with a bandwidth of 6-26.5 GHz, a resistance of the on-chip resistor R1 is 500-600 ohm.

* * * * *